(12) United States Patent
Vellei et al.

(10) Patent No.: US 12,733,224 B2
(45) Date of Patent: Sep. 8, 2026

(54) SEMICONDUCTOR DEVICE HAVING MACRO CELLS

(71) Applicant: Infineon Technologies AG, Neubiberg (DE)

(72) Inventors: Antonio Vellei, Villach (AT); Stefan Tophinke, Paderborn (DE)

(73) Assignee: Infineon Technologies AG, Neubiberg (DE)

( * ) Notice: Subject to any disclaimer, the term of this patent is extended or adjusted under 35 U.S.C. 154(b) by 600 days.

(21) Appl. No.: 18/117,711

(22) Filed: Mar. 6, 2023

(65) Prior Publication Data

US 2023/0290827 A1 Sep. 14, 2023

(30) Foreign Application Priority Data

Mar. 14, 2022 (DE) ........................ 102022105886.7

(51) Int. Cl.

| | |
|---|---|
| ***H10D 64/27*** | (2025.01) |
| ***H10D 12/00*** | (2025.01) |
| ***H10D 12/01*** | (2025.01) |
| ***H10D 30/66*** | (2025.01) |
| ***H10D 62/10*** | (2025.01) |

(52) U.S. Cl.
CPC ......... *H10D 62/127* (2025.01); *H10D 12/032* (2025.01); *H10D 12/481* (2025.01)

(58) Field of Classification Search
CPC .... H10D 12/03; H10D 12/461; H10D 12/481; H10D 30/0297; H10D 30/668
See application file for complete search history.

(56) References Cited

U.S. PATENT DOCUMENTS

| | | | | |
|---|---|---|---|---|
| 5,864,159 | A * | 1/1999 | Takahashi ............ | H10D 30/668 257/334 |
| 6,337,498 | B1 | 1/2002 | Hasegawa et al. | |
| 11,018,251 | B2 * | 5/2021 | Nishiguchi .......... | H10D 62/154 |
| 2005/0151190 | A1 * | 7/2005 | Kotek ................. | H10D 30/668 257/341 |
| 2005/0194638 | A1 | 9/2005 | Kouzuki et al. | |
| 2008/0197397 | A1 * | 8/2008 | Parthasarathy ...... | H10D 30/668 257/302 |

(Continued)

FOREIGN PATENT DOCUMENTS

| | | | |
|---|---|---|---|
| CN | 102315253 | A | 1/2012 |
| DE | 10156468 | A1 | 5/2003 |

(Continued)

*Primary Examiner* — Eric A. Ward
(74) *Attorney, Agent, or Firm* — Murphy, Bilak & Homiller, PLLC

(57) ABSTRACT

A semiconductor device includes a transistor having macro cells. A plurality of the macro cells include a first macro cell and a second macro cell. Each first and second macro cell includes trenches formed in a first main surface of a semiconductor substrate. The trenches pattern the semiconductor substrate into mesas and include a conductive trench, with a conductive material in the conductive trench being electrically connected to a terminal. A majority of all trenches of the first macro cell exclusively run in a first direction. A majority of all trenches of the second macro cell exclusively run in a second direction different from the first direction. At least one first macro cell is arranged adjacent to at least one second macro cell.

14 Claims, 11 Drawing Sheets

Fig. 1A

(56) References Cited

U.S. PATENT DOCUMENTS

| | | | | |
|---|---|---|---|---|
| 2014/0175541 | A1* | 6/2014 | Matri' | H10D 30/63 257/334 |
| 2018/0005959 | A1* | 1/2018 | Wang | H10D 64/117 |
| 2019/0296148 | A1* | 9/2019 | Tanaka | H01L 23/4824 |
| 2023/0144304 | A1* | 5/2023 | Chang | H10D 62/127 257/288 |
| 2023/0197786 | A1* | 6/2023 | Mori | H10D 62/155 257/77 |
| 2024/0014275 | A1* | 1/2024 | Sanda | H10D 30/668 |
| 2024/0105835 | A1* | 3/2024 | Shinoda | H10D 64/252 |

FOREIGN PATENT DOCUMENTS

| | | | |
|---|---|---|---|
| DE | 102015121497 | A1 | 6/2017 |
| DE | 102020112193 | A1 | 11/2020 |

* cited by examiner 196
186
197
186

10
106
106
186
106
106
170

SEMICONDUCTOR DEVICE HAVING MACRO CELLS

TECHNICAL FIELD

Bipolar semiconductor devices such as insulated-gate bipolar transistors (IGBTs) are suitable for use as power switches. For example, an IGBT may be used as an electronic switch for switching an electrical load. For instance, IGBTs may be used as power switches in motor drive inverters, as well as in direct-current (DC) to DC power converters. Attempts are being made to improve operating parameters of semiconductor devices.

It is desirable to provide an improved semiconductor device.

SUMMARY

According to embodiments, a semiconductor device comprises a transistor. The transistor comprises a plurality of macro cells. The plurality of macro cells comprises a first macro cell and a second macro cell. Each of the first and the second macro cells comprises a plurality of trenches formed in a first main surface of a semiconductor substrate. The trenches pattern the semiconductor substrate into mesas. The plurality of trenches comprises a conductive trench, wherein a conductive material arranged in the conductive trench is electrically connected to a terminal. A majority of all the trenches of the first macro cell exclusively run in a first direction. A majority of all the trenches of the second macro cell exclusively run in a second direction different from the first direction. At least one first macro cell is arranged adjacent to at least one second macro cell.

For example, the first macro cell may further comprise a first connection trench running in the first direction. A conductive material may be arranged in the first connection trench. The conductive material of the first connection trench may be connected to a plurality of conductive trenches of the second macro cell.

The semiconductor may further comprise an insulating layer over the semiconductor substrate. A first contact groove may be formed in the insulating layer and may contact a mesa of the first macro cell. A lateral extension of the first contact groove in the first direction may be larger than the lateral extension of the first contact groove in the second direction.

The semiconductor device may further comprise a second contact groove formed in the insulating layer. The second contact groove may contact a mesa of the second macro cell. The lateral extension of the second contact groove in the second direction may be larger than the lateral extension of the second contact groove in the first direction.

For example, the mesa contacted by the first contact groove comprises a doped semiconductor portion in contact with the first contact groove.

For example, the terminal to which the conductive trench is electrically connected may be a gate terminal or a source terminal.

According to embodiments, the trenches in the first macro cell and the trenches in the second macro cell may comprise a source trench and a gate trench, respectively. A conductive material in the source trench may be electrically connected to a source terminal, and the conductive material in the gate trench may be electrically connected to a gate terminal.

The plurality of mesas may comprise a dummy mesa that is disconnected from a terminal.

For example, a number of trenches of the first macro cell may be identical with the number of trenches of the second macro cell. According to further embodiments, the number of trenches of the first macro cell may be different from the number of trenches of the second macro cell.

The first and the second macro cells may be arranged to form a checkerboard pattern. According to further embodiments, the first and the second macro cells may be arranged to form an arbitrary pattern, e.g. a fishbone pattern.

For example, the first and the second macro cells are arranged in columns and rows. According to embodiments, an array of macro cells may comprise an odd number of columns of macro cells and an odd number of rows of macro cells.

According to further embodiments, a semiconductor device comprises a transistor. The transistor comprises a plurality of macro cells. The plurality of macro cells comprises first macro cells and second macro cells. Each of the first and the second macro cells comprises a plurality of trenches formed in a first main surface of a semiconductor substrate. The trenches pattern the semiconductor substrate into mesas. The plurality of trenches comprises a conductive trench, wherein a conductive material arranged in the conductive trench is electrically connected to a terminal. The trenches of the first macro cell run in a first direction, the trenches of the second macro cell run in a second direction different from the first direction. At least one of the first macro cells further comprises a first connection trench running in the first direction. A conductive material is arranged in the first connection trench. The conductive material of the first connection trench is connected to a plurality of conductive trenches of at least one of the second macro cells.

For example, the terminal may be a gate terminal or a source terminal.

According to embodiments, the trenches in the first macro cell and the trenches in the second macro cell further comprise a source trench, respectively. A conductive material in the source trench is electrically connected to a source terminal.

For example, the trenches in the first macro cell and the trenches in the second macro cell further comprise a gate trench, respectively. A conductive material in the gate trench is electrically connected to a gate terminal.

According to further embodiments, a semiconductor device comprises a transistor. The transistor comprises a comb cell comprising a plurality of trenches formed in a first main surface of a semiconductor substrate. The trenches pattern the semiconductor substrate into mesas. The plurality of trenches comprises gate trenches and source trenches, a source connection trench, and a gate connection trench. The source connection trench electrically connects a conductive material in the source trenches to a source terminal. The gate connection trench electrically connects a conductive material in the gate trenches to a gate terminal. The gate trenches and the source trenches run in a first direction. The source connection trench and the gate connection trench run in a second direction different from the first direction.

For example, the transistor may comprise a plurality of comb cells arranged along the first direction. An intermediate region may be arranged between two neighbouring comb cells, wherein trenches are absent from the intermediate region.

According to embodiments, the semiconductor device may further comprise a passivation layer at least partly above a metallization layer at a frontside of the semiconductor device, the passivation layer comprising marker portions indicating the orientation of at last one of the macro cells.

According to further examples, a semiconductor device comprises a semiconductor substrate and an insulating layer over the semiconductor substrate. The semiconductor device comprises a plurality of macro cells, the plurality of macro cells comprising a first macro cell and a second macro cell. The first macro cell comprises first contact grooves for electrically contacting a portion of the semiconductor substrate and the second macro cell comprises second contact grooves for electrically contacting a portion of the semiconductor substrate. The first and the second contact grooves are arranged in the insulating layer. A majority of the first contact grooves exclusively run in a first direction, and a majority of the second contact grooves exclusively run in a second direction different from the first direction. At least one first macro cell is arranged adjacent to at least one second macro cell.

According to embodiments, a method for manufacturing a semiconductor component comprises forming a semiconductor device comprising a transistor, the transistor comprising a plurality of macro cells, the plurality of macro cells comprising a first macro cell and a second macro cell. Each of the first and the second macro cells comprises a plurality of trenches formed in a first main surface of a semiconductor substrate, the trenches patterning the semiconductor substrate into mesas. A majority of all the trenches of the first macro cell exclusively run in a first direction, and a majority of all the trenches of the second macro cell exclusively run in a second direction different from the first direction. The method further comprises bonding a bond wire to the semiconductor device in a bond area above at least one of the first macro cell and the second macro cell.

The method may further comprise determining a location of the bond area for the subsequent step of bonding the bond wire, the location of the bond area being above either one of the first macro cell and the second macro cell depending on a desired bond angle between the bonding wire and at least one of the first direction and the second direction.

The method may further comprise forming a passivation layer at least partly above a metallization layer at a frontside of the semiconductor device, the passivation layer comprising marker portions indicating the orientation of at last one of the macro cells.

BRIEF DESCRIPTION OF THE DRAWINGS

The accompanying drawings are included to provide a further understanding of the embodiments and are incorporated in and constitute a part of this specification. The drawings illustrate embodiments of semiconductor devices, e.g. vertical power semiconductor devices and together with the description serve to explain principles of the embodiments. Further embodiments are described in the following detailed description and the claims.

DETAILED DESCRIPTION

Figure 1A:
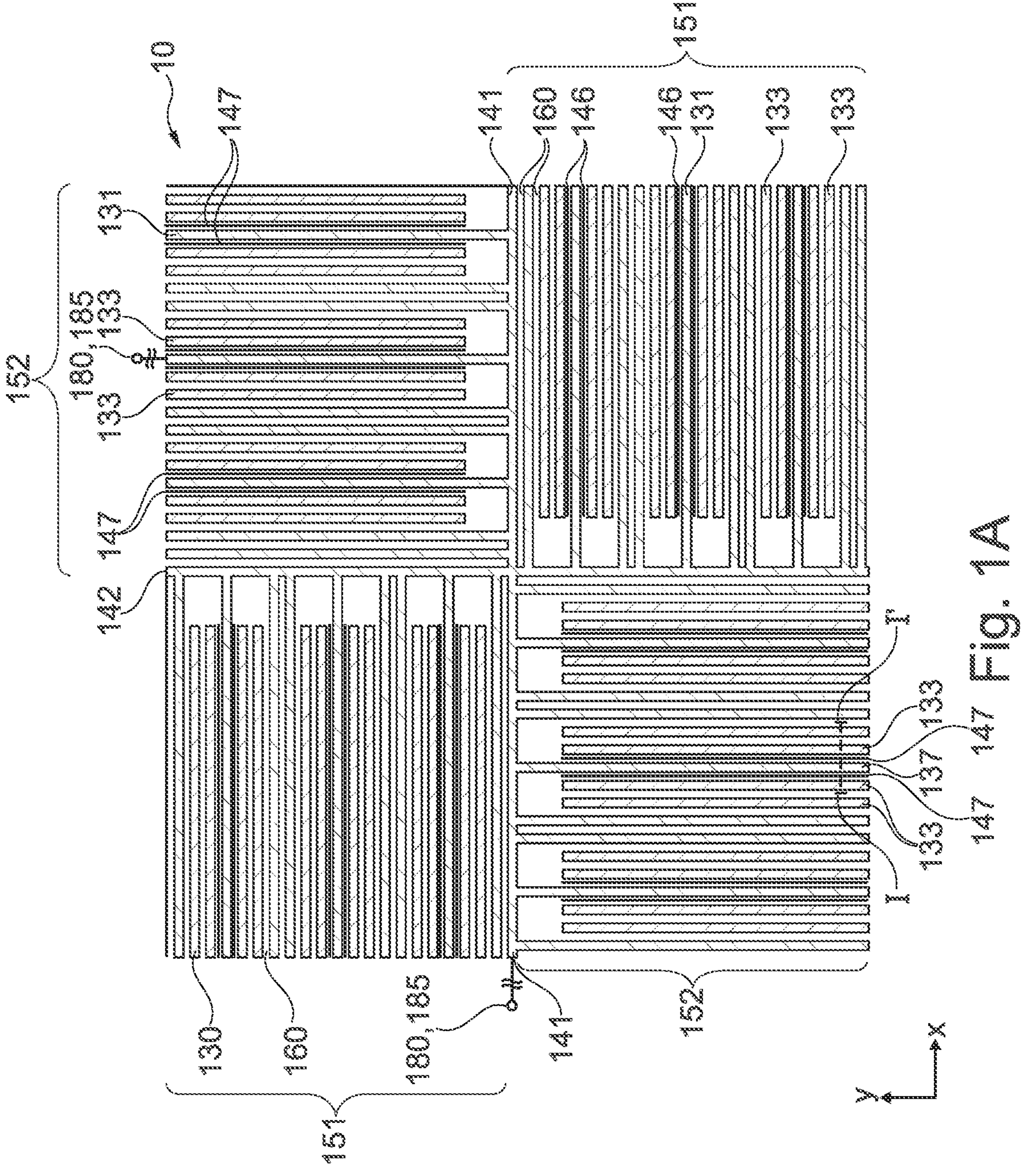
FIG. 1A shows schematic horizontal cross-sectional view of a semiconductor device according to embodiments.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The description of the embodiments is not limiting. In particular, elements of the embodiments described hereinafter may be combined with elements of different embodiments.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

The term "electrically connected" intends to describe a low-ohmic electric connection between the elements electrically connected together.

The Figures and the description illustrate relative doping concentrations by indicating "−" or "+" next to the doping type "n" or "p". For example, "$n^-$" means a doping concentration which is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting.

In the following, embodiments will be described. As is to be noted, specific implementations, features and descriptions of functionality discussed with reference to a certain Figure may also be applied to the further Figures unless indicated otherwise or unless evidently inappropriate.

FIG. 1A shows a horizontal cross-sectional view of a portion of a semiconductor device 10 according to embodiments. As is illustrated in FIG. 1A, the semiconductor device 10 comprises a transistor. The transistor comprises a plurality of macro cells 151, 152. The plurality of macro cells 151, 152 comprises a first macro cell 151 and a second macro cell 152. Each of the first and the second macro cells comprises a plurality of trenches 130 which are formed in a first main surface of a semiconductor substrate. The trenches pattern the semiconductor substrate into mesas 160. A vertical cross-sectional view of the semiconductor device 10 according to embodiments will be discussed later.

The plurality of trenches 130 comprises a conductive trench 131. A conductive material arranged in the conductive trench 131 is electrically connected to a terminal 180, 185. A majority of all the trenches 130 of the first macro cell 151 exclusively run in a first direction 196 (cf. FIGS. 3A-3C) e.g. the x-direction. Moreover, a majority of the trenches 130 of the second macro cell 152 exclusively run in a second direction 197 (cf. FIGS. 3A-3C), e.g. the y-direction, different from the first direction 196. At least one first macro cell 151 is arranged adjacent to at least one second macro cell 152.

The term "majority" as used in the context of the present disclosure relates to a larger or predominant part of the trenches of a specific macro cell. For example, the term "majority" may mean more than 50%, e.g. more than 75% and more specifically, more than 90%. The term "a majority of all the trenches of the first (second) macro cell run in a first (second) direction" is intended to mean that the trenches of the majority of all the trenches of the first (second) macro cell extend in one linear direction, without any corners or turns.

For example, the first macro cell may be similar in construction to the second macro cell 152. Source regions 201 (not illustrated in FIG. 1A, shown in FIG. 2) may be formed in any of the mesas 160. By way of example, a conductive trench 131 of the plurality of trenches 130 may be connected to a source terminal 180 and may implement a source trench. According to further embodiments, a conductive trench 131 may be electrically connected to a gate terminal 185 and may implement a gate trench. The single trenches 130 may be identical or different from each other. Moreover, the mesas 160 may be identical in shape and width or may be different from each other.

The first macro cell 151 may further comprise a first connection trench 141 that runs in the first direction 196. A conductive material may be arranged in the first connection trench 141. The conductive material of the first connection trench 141 may be connected to a plurality of conductive trenches 131 of the second macro cell 152. Moreover, the second macro cell 152 may further comprise a second connection trench 142 that runs in the second direction 197. A conductive material may be arranged in the second connection trench 142. The conductive material of the second connection trench 142 may be connected to a plurality of conductive trenches 131 of the first macro cell 151.

The first direction 196 may be perpendicular to the second direction 197.

The first and second connection trenches 141, 142 may be a single trench or may comprise a plurality of parallel trenches. For example, the first and second connection trenches may comprise two or three trenches in parallel for each macro cell 151, 152. In this way, even in case of an electrical interruption of one trench electrical continuity may be secured. The first and the second connection trenches 141, 142 may have an identical width, respectively. According to further examples, the width of the first connection trench 141 may be different from the width of a second connection trench 142. The width of any of the first and second connection trenches 141, 142 may be identical to the width of the further trenches 130, e.g. conductive trenches. According to further examples, the width of any of the first and second connection trenches 141, 142 may be different from the width of any of the further trenches 130.

As is shown in FIG. 1A, the connection trench 141 that is a component of the first macro cell 151 serves as a connection trench for the conductive trenches of the second macro cell 152. As a consequence, the conductive trenches 131 of the second macro cell 152 are electrically contacted outside the second macro cell 152. In a similar manner, one of the trenches 130 of the second macro cell 152 serves to electrically contact the trenches 130 of the first macro cell 151.

For example, any of the first and the second macro cells 151, 152 may comprise more than 50 trenches 130. For example, any of the first and the second macro cells 151, 152 may comprise more than 100 trenches 130. For example, a width of any of the trenches, measured perpendicularly to an extension direction may be larger than 100 nm, for example larger than 400 or 500 nm. Further, the width may be smaller than 2 μm, for example, smaller than 1 μm.

Accordingly, FIG. 1A shows an arrangement of trenches that are rotated with respect to other trenches. In more detail, according to embodiments, the semiconductor device comprises trenches that are rotated by 90°. Due to the arrangement of the rotated trenches in different macro cells the trenches may be arranged so as to reduce the area consumption needed for rotation.

According to embodiments, trenches of differently orientated macro cells are electrically connected, e.g. by means of connection trenches forming part of an adjacent macro cell. Due to this arrangement, the area consumption needed for the rotation may be reduced.

FIG. 1A further shows first contact grooves 146 and second contact grooves 147. The first macro cell 151 further may comprise a first contact groove 146, the second macro cell may comprise a second contact groove 147. As will be explained below with reference to FIG. 1B, the semiconductor device further comprises an insulating layer 105 over the first main surface 110 of the semiconductor substrate 100 and a conductive layer 106 over the insulating layer 105. The first and the second contact grooves 146, 147 are formed in the insulating layer 105. The first and the second contact grooves 146, 147 are filled with a conductive material. For example, the conductive material may be a portion of the conductive layer 106. According to further examples, the conductive material may be different from the conductive layer 106.

As is shown in FIG. 1A, the first contact grooves 146 run in the first direction, and the second contact grooves 147 run in the second direction. As is further shown in FIG. 1A, the first and the second contact grooves 146, 147 may continuously run along the trenches. According to further embodiments, any of the first and the second contact grooves 146, 147 may be interrupted.

The first contact groove 146 may e.g. contact a mesa 160 of the first macro cell 151. The second contact groove 147 may e.g. electrically contact a mesa 160 of the second macro cell 152. The conductive layer 106 may be electrically connected to a source terminal. Accordingly, the first and second contact grooves 146, 147 may establish an electrical connection to the source terminal.

In particular, a lateral extension of the first contact groove 146 in the first direction is larger than the lateral extension of the first contact groove 146 in the second direction. Accordingly, the first contact groove 146 has an elongated form aligned along the extension direction of the trenches 130 of the first macro cell 151. In a similar manner, the lateral extension of the second contact groove 147 in the second direction is larger than the lateral extension of the second contact groove 147 in the first direction. Accordingly, also the second contact groove 147 is aligned along the extension direction of the trenches 130 of the second macro cell 152.

Figure 2:
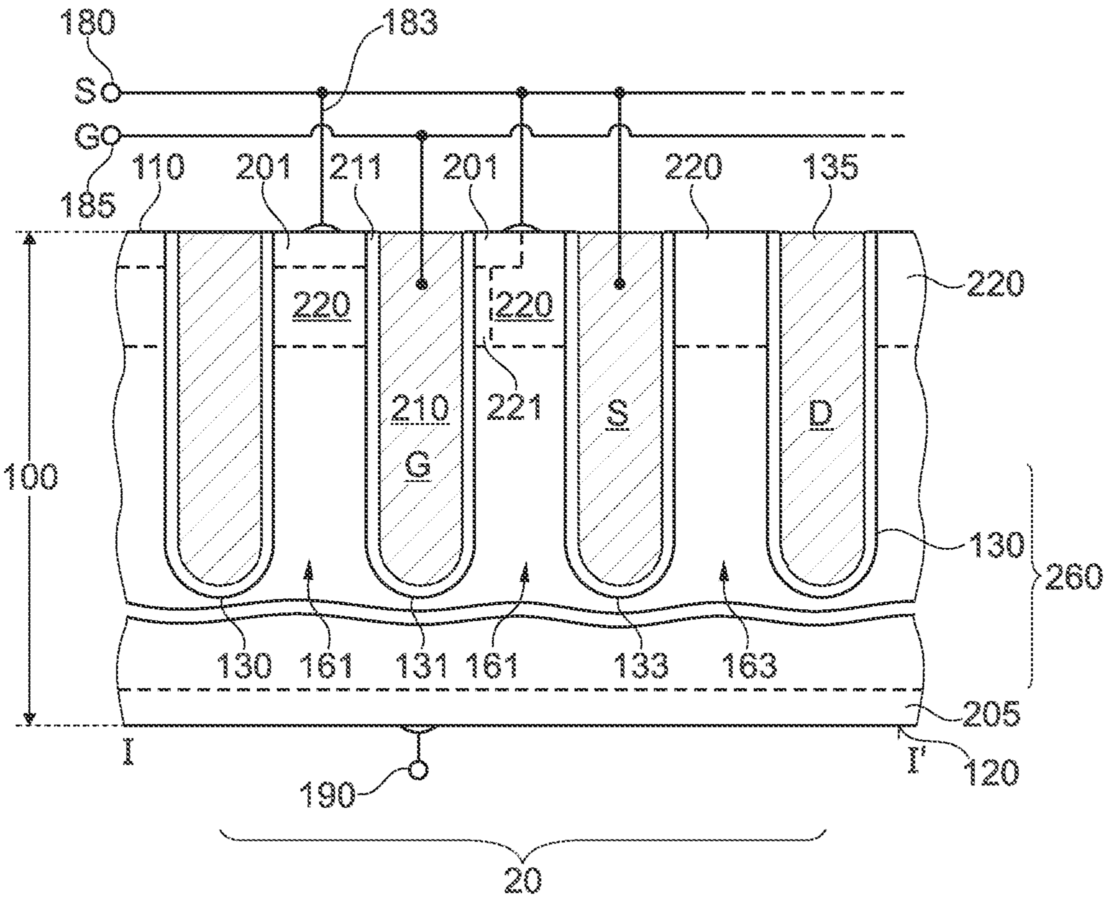
FIG. 2 shows a vertical cross-sectional view of a portion of a semiconductor device according to embodiments.

For example, any of the first and the second contact grooves 146, 147 may be electrically connected to source regions 201 (not shown in FIG. 1A, shown in FIG. 2). Moreover, any of the first and second contact grooves 146, 147 may be electrically connected to a conductive trench 131, e.g. a source trench. For example, in the cross-sectional view of FIG. 1A, the conductive trench 131 may be arranged between two source regions 201. For example, a source trench may by electrically connected to a source terminal in an edge portion of the semiconductor device via contact elements (not illustrated).

According to embodiments, a gate trench may be electrically connected to a gate terminal in an edge portion of the semiconductor device via a connection trench or a contact element (not illustrated).

Due to the presence of the first and second connection trenches 141, 142, a potential (e.g. the gate potential or the source potential) is brought to adjacent macro cells. As a result, macro cells 151, 152 may be electrically connected in an easy manner. In particular, the macro cells 151, 152 may be electrically connected using a reduced number of contact elements.

Figure 1B:
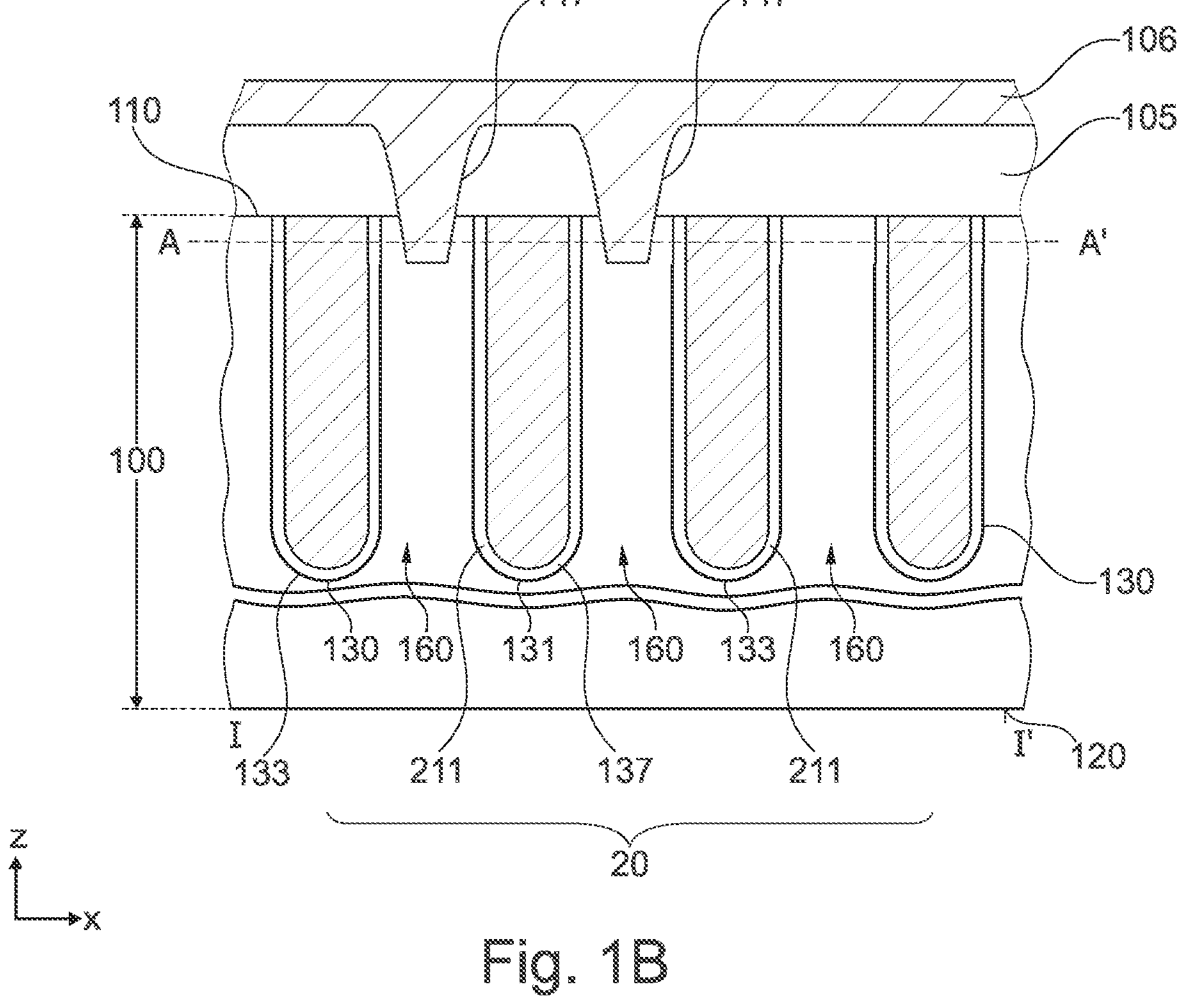
FIG. 1B shows a schematic vertical cross-sectional view of the semiconductor device illustrated in FIG. 1A.

FIG. 1B shows a vertical cross-sectional view of a portion of the semiconductor device illustrated in FIG. 1A. For example, the cross-sectional view may be taken between I and I' along the x direction. FIG. 1B shows a portion of a transistor 20 formed in a semiconductor substrate 100. A plurality of trenches 130 are formed in a first main surface 110 of the semiconductor substrate 100. An insulating layer 105 may be formed over the first main surface. A conductive layer 106 may be arranged over the insulating layer 105. Contact grooves 147 are formed in the insulating layer 105. The contact grooves 147 extend to the semiconductor substrate 100 and are configured to establish an electrical contact to the semiconductor substrate 100, e.g. to a mesa portion between adjacent trenches 130. The contact grooves 147 may extend in a direction intersecting the depicted plane of the drawing. A conductive material filled in the contact grooves 147 may be the same material as the material of the conductive layer 106 or may be different. For example, the conductive material in the contact grooves may comprise any conductive material such as polysilicon, metal, and metal alloy.

A conductive material arranged in the trenches 130 is insulated from adjacent semiconductor material by means of a dielectric layer 211.

The conductive material in the trenches may be electrically connected to an appropriate terminal. For example, the source trenches 133 may be electrically connected to a source terminal, e.g. by means of a contact element extending through the insulating layer 105 or a connection trench. The gate trench 137 may be electrically connected to a gate terminal by means of a connection trench or a contact element. The contact elements may be arranged in an edge portion of the semiconductor device.

The line between A and A' indicates an example of a position of the cross-sectional view illustrated in FIG. 1A.

FIG. 2 shows a schematic vertical cross-sectional view of a portion of an example of a semiconductor device in a semiconductor substrate 100 having a first main surface 110. For example, the cross-sectional view of FIG. 2 may be taken between I and I' in FIG. 1A.

The cross-sectional view of FIG. 2 is taken perpendicular to an extension direction of the trenches 130.

The semiconductor device 10 comprises a transistor 20. The transistor 20 may comprise a drift region 260 of a first conductivity type and a body region 220 of a second conductivity type between the drift region 260 and the first main surface 110. The transistor 20 may further comprise a plurality of trenches 130 in the first main surface 110. The trenches 130 pattern the semiconductor substrate 100 into a plurality of mesas 160. The mesas 160 may e.g. comprise a first mesa 161 and a dummy mesa 163. The plurality of trenches 130 comprises at least one conductive trench 131. For example, the conductive trench 131 may be electrically connected to a source terminal 180. According to the example shown in FIG. 2, the first mesa 161 may be arranged at a first side of the conductive trench 131 and a dummy mesa 163 may be arranged at a second side of the conductive trench 131.

Within the present disclosure, the term "dummy mesa" may mean a mesa which is not used for the purpose of carrying the load current during the on-state of the transistor. For example, a controllable conductive channel cannot be configured to be formed in the dummy mesa. For example, a transition between a first load terminal, e.g. the source terminal 180 and the dummy mesa 163 may provide an electric insulation at least for charge carriers of the first conductivity type.

By way of example, the transistor 20 or a corresponding transistor cell may be configured to prevent a load current from passing said transition between the dummy mesa 163 and the corresponding load terminal, e.g. the source terminal 180. According to examples, the dummy mesa 163 does not allow for inducing an inversion channel. To be more specific, according to examples and in contrast to the first mesa 161, the dummy mesa 163 does not conduct the load current during the conducting state of the transistor. For example, the dummy mesa 163 may be considered as a decommissioned mesa that is not used for the purpose of carrying the load current.

According to further implementations, the dummy mesa 163 is not electrically connected to e.g. a corresponding load terminal, e.g. the source terminal 180 but is electrically insulated from the source terminal 180, e.g. by means of an insulation layer (not shown in FIG. 2A). For example, the transition between the corresponding load terminal and the dummy mesa 163 may be implemented in a manner so as to provide an electrical insulation not only for charge carriers of the first conductivity type, i.e. majority carriers, but also for charge carriers of the second conductivity type, i.e. minority carriers. According to this implementation, the dummy mesa 163 may not comprise a source region 201. Further or alternatively, the dummy mesa 163 may not comprise a channel region. Further or alternatively, the dummy mesa 163 may not be contacted by a contact plug such as a low-ohmic contact. According to this implementation, the term "dummy mesa" may refer to a mesa in which no current at all passes a transition between the mesa and a corresponding load terminal, e.g. the source terminal 180.

According to a further implementation, the dummy mesa 163 may be electrically connected to a corresponding load terminal, e.g. the source terminal 180 by a transition which provides an electrical insulation only for charge carriers of the first conductivity type but not for charge carriers of the second conductivity type. To be more specific, according to this implementation, the dummy mesa may allow a current of charge carriers of the second conductivity type, e.g. a hole current to pass the transition. For example, depending on an electrical potential of an electrode in a trench adjacent to the dummy mesa 163, such hole current may only temporarily present. For example, this hole current may be present shortly before carrying out a turn-off operation, e.g. in order to reduce the total charge carrier concentration present in the semiconductor body.

According to a further implementation, the dummy mesa may be implemented in a manner that a conductive channel is not configured to be formed, the conductivity of the conductive channel being controllable e.g. by means of an electrode in a trench adjacent to the dummy mesa.

As has been explained above, the dummy mesa may be implemented by a mesa being disconnected from the source terminal 180. According to further embodiments, this expression may mean that the dummy mesa is connected to the source terminal 180 via a contact having a higher resistance, e.g. ohmic resistance than the source contact 183 at least for (majority) carriers of a first conductivity type, e.g. electrons. According to further implementations, the term "dummy mesa" may also refer to a mesa that blocks carriers of the first conductivity type, e.g. electrons, but allows for a limited current of carriers of the second conductivity type, e.g. holes.

According to these examples, a source region may be arranged in the dummy mesa. Further, a body region of the second conductivity type may be arranged in the dummy mesa. According to further examples, a source region 201 may be absent from the dummy mesa 163. According to further embodiments, the body region of the second conductivity type may not be arranged in the dummy mesa.

The term "conductive trench" as used in the context of the present disclosure is intended to mean a trench, wherein a material inside the conductive trench comprises an electrically conductive material such as a metal or polysilicon. Further, the material inside the conductive trench is electrically connected to a terminal. Such a trench may also be referred to as a "gate trench". According to embodiments, a gate electrode may be arranged in the conductive trench and a conductive channel is configured to be formed in semiconductor material adjacent to at least one sidewall of the conductive trench. This may, for example, be the case when a source region is adjacent to at least one sidewall of the conductive trench, the source region being electrically connected to the source terminal. In this case, the conductive trench may also be referred to as an "active trench".

According to further embodiments, a gate electrode may be arranged in the conductive trench, and no conductive channel is configured to be formed in semiconductor material adjacent to at least one sidewall of the conductive trench. This may, for example, be the case when no source region is adjacent to at least one sidewall of the conductive trench. Such a gate trench may also be referred to as a "dummy gate trench".

According to further embodiments, a conductive material inside the conductive trench may be electrically connected to a source terminal. Such a trench may also be referred to as a "source trench". A source region 201 may be present in the mesa 160 directly adjacent to a source trench 133. According to further embodiments, a source region 201 may be absent from the mesa 160 directly adjacent to the source trench 133. In this case, the source trench may be referred to as a "dummy source trench".

According to embodiments, the semiconductor device 10 described in the context of the present specification may relate to an IGBT formed in the semiconductor substrate 100. A source region 201 of the first conductivity type (e.g. n-type) is disposed adjacent to the first main surface 110. A back side region 205 of the second conductivity type is disposed adjacent to a second main surface 120. For example, the back side region 205 which is also referred to as an emitter, may be of the second conductivity type. According to embodiments, the back side region 205 may comprise portions of the second conductivity type and may further comprise portions of the first conductivity type. According to embodiments, there may be stripe-shapes portions of the first conductivity type and stripe-shaped portions of the second conductivity type. The transistor 20 comprises the drift region 260, the body region 220, the source region 201 and the back side region 205. The transistor further comprises a conductive trench 131 that is formed in the first main surface 110 and which extends to the drift region 260. A dielectric layer 211 may be disposed adjacent to the sidewalls and the bottom side of the conductive trench 131. The dielectric layer 211 may implement a gate dielectric layer that insulates the gate electrode 210 from adjacent semiconductor material.

The source region 201 is electrically connected to the source terminal 180, for example my means of a source conductive layer 181 that is connected to the source contacts 183. The back side region 205 is electrically connected to a back side terminal 190, e.g. via a back side electrode that may be implemented by a back side conductive (metallization) layer.

When a predetermined voltage $V_{CE}$ is applied between the back side terminal 190 and the source terminal 180, and a predetermined voltage is applied between the gate terminal and the source terminal 180, that is, when the gate is turned on, an inversion layer (conductive channel) is formed in the body region 220 at a portion adjacent to the gate electrode 210. When the conductive channel is formed, for example, in case of the source region being n-doped, electrons may flow from the source region 201 to the drift region 260. Holes may move from the back side region 205 into the drift region 260. This results in a great reduction of resistance of the drift region 260 due to a conductivity modulation which increases the current capacity of the IGBT. A voltage drop between the back side terminal 190 and the source terminal 180 of the IGBT at this time is referred to as an on state voltage ($V_{CE,SAT}$). The on state voltage $V_{CE,SAT}$ indicates losses of the semiconductor device.

When the gate is turned off, i.e. the gate voltage $V_{GE}$ between the gate terminal 185 and the source terminal 180 is reduced to zero or reverse-bias, no inversion layer is formed in the body region 220. Accordingly, the flow of electrons from the source region 201 stops. Thereafter, the electrons and holes accumulated in the drift region 260 either move to the back side region 205 and the source region 201, respectively, or recombine to disappear.

It is to be noted that the above explanation has been given for a specific constellation of n- and p-doped regions. As is clearly to be understood, the concept may be modified so that the function of electrons and holes is reversed.

Further, the above explanation of an IGBT is merely by way of example. The present disclosure may be likewise applied to any kind of semiconductor device comprising trenches or contact grooves extending through a dielectric layer, the contact grooves electrically connecting a semiconductor portion to a conductive layer over the dielectric layer arranged over the semiconductor portion.

According to one or more embodiments, the trenches 130, 131 may extend in a direction perpendicular to the depicted plane of the cross-section. Transistors or transistor cells of the semiconductor device may comprise gate trenches 137 in which a gate electrode 210 is arranged. The transistors or transistor cells may comprise further trenches, e.g. trenches filled with a conductive material that is electrically coupled to the source terminal 180 or that is otherwise connected or in a floating state. A dielectric layer 211 may be arranged in the trenches 130. For example, the dielectric layer 211 may insulate the conductive material from adjacent semiconductor material.

Figure 3A:
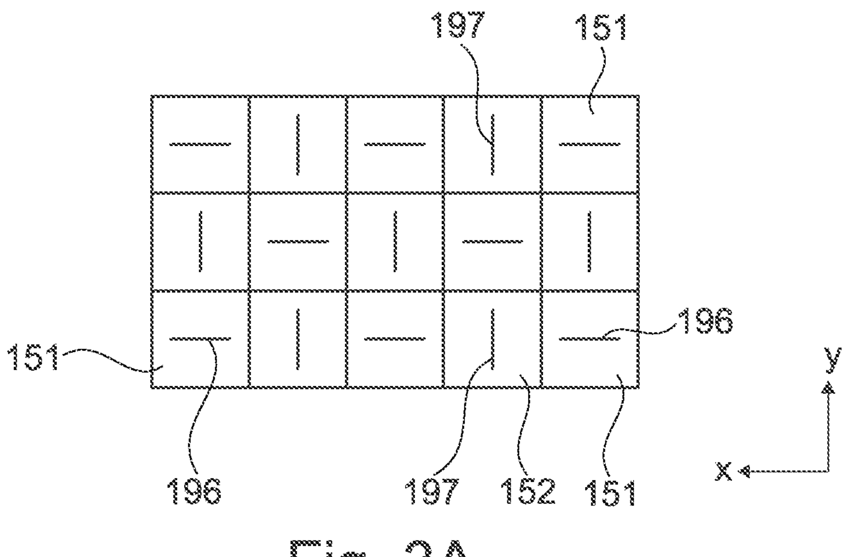
FIG. 3A shows a schematic layout of an arrangement of first and second macro cells according to embodiments.

FIG. 3A shows a schematic layout of first and second macro cells 151, 152. As is illustrated in FIG. 3A, a size of the first macro cell 151 may be identical with a size of the second macro cell 152. In more detail, the first macro cell 151 may comprise an identical number of trenches 130 as the second macro cell 152. Further, the width and the length of the first macro cell may be identical with the width and the length of the second macro cell, respectively. For example, the first and the second macro cells 151, 152 may be arranged in a checkerboard pattern. According to further embodiments, the first and the second macro cells may be arranged in columns and rows.

FIG. 3A further illustrates by way of example a first direction 196 representing a main extension direction of the first contact grooves 146 (not depicted in FIG. 3A) and a second direction 197 representing a main extension direction the second contact grooves 147 (not depicted in FIG. 3A) to show an alignment direction of the trenches 130 of the first and the second macro cells 151, 152. The trenches 130 (not depicted in FIG. 3A) are aligned parallel to the first direction 196 in the first macro cells 151 and parallel to the second direction 197 in the second macro cells 151. According to a further interpretation, the first direction 196 illustrated in FIG. 3A indicates an alignment direction of the first contact grooves 146 of the first macro cell 151. Further, the illustrated second direction 197 indicates an alignment direction of the second contact grooves 147 of the second macro cell 152. As is to be clearly understood, any of the first and the second macro cells 151, 152 may comprise a plurality or an arbitrary number of first contact grooves 146 or second contact grooves 147 or trenches 130, respectively.

According to embodiments that are illustrated in FIG. 3A, each of the first and the second macro cells may have a square shape, i.e. a lateral extension in the first direction may be equal to a lateral extension in the second direction. The arrangement of first and second macro cells 151, 152 that is illustrated in FIG. 3A may have a rectangular shape. For example, the number of columns in which the first and the second macro cells 151, 152 are arranged may be an odd number. In this case, it is possible to easily integrate the edge macro cells with device termination structures.

According to further embodiments, the number of columns may be an even number. Still further, the array of first and second macro cells 151, 152 does not need to be rectangular but may have any arbitrary shape such as T-shape or any other.

According to further embodiments, the first and the second macro cells may have a square shape of different sizes, respectively.

Figure 3B:
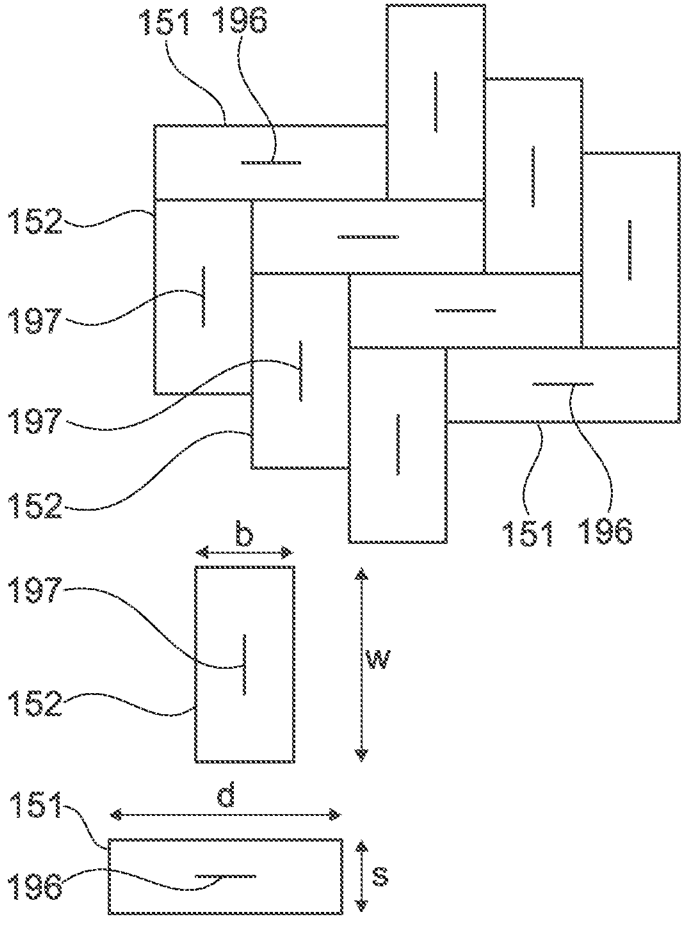
FIG. 3B shows a schematic layout of an arrangement of first and second macro cells according to further embodiments.

According to embodiments that are illustrated in FIG. 3B, the size of the first macro cell 151 may be different from the size of the second macro cell 152. Moreover, a first lateral extension d of the first macro cell 151 in the first direction may be different from a second lateral extension s in the second direction. For example, the first extension d may be larger than s or vice versa. In addition, the second macro cells 152 may have a second lateral extension w in the second direction which is larger than the first lateral extension b in the first direction. The first lateral extension d of the first macro cell 151 may be larger than the first extension w of the second macro cell 152. The first macro cell 151 may have the same number of trenches 130 as the second macro cell 152. According to further embodiments, the number of trenches may be different. Further, the first macro cell 151 may have the same number of first contact grooves 146 as the number of second contact grooves 147 of the second macro cell 152. According to further embodiments, the number of contact grooves may be different.

For example, the second lateral extension s in the second direction of the first macro cell 151 may be larger than the first lateral extension b in the first direction of the second macro cell or may be different.

As is further illustrated in FIG. 3B, the first and the second macro cells 151, 152 may be arranged in a kind of fishbone pattern so that a portion of the first macro cell 151 is arranged directly adjacent to a further portion of a further first macro cell 151 and so on.

Figure 3C:
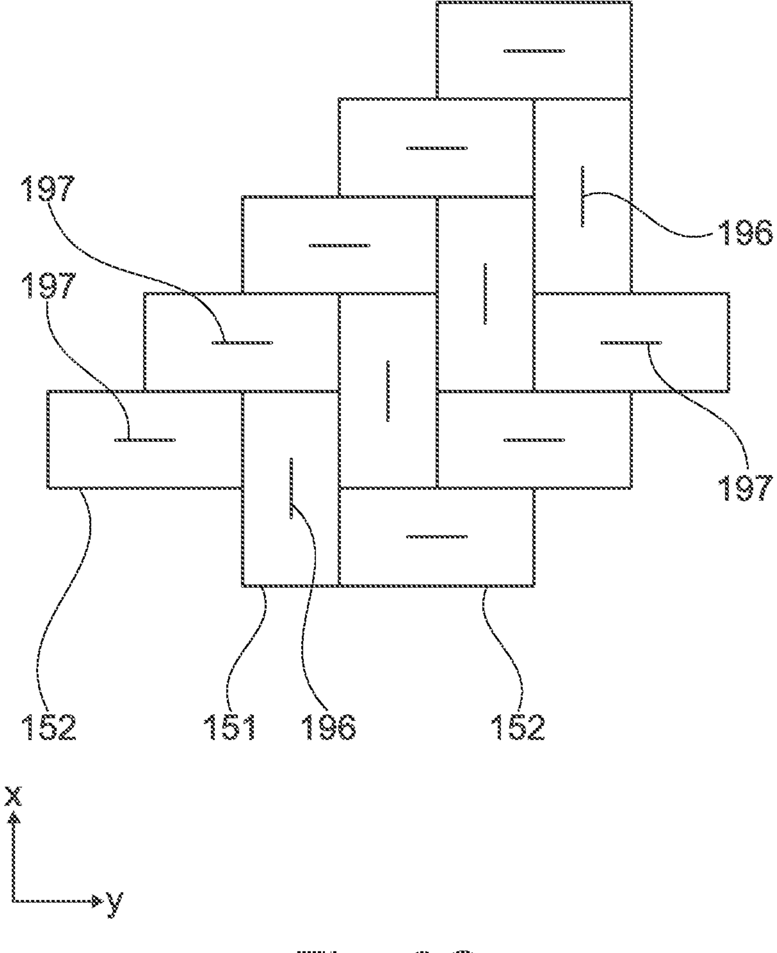
FIG. 3C shows a schematic layout of an arrangement of first and second macro cells according to further embodiments.

According to further embodiments, which are illustrated in FIG. 3C, the first and the second macro cells 151, 152 may be identical in size and may be arranged in a similar manner as is illustrated in FIG. 3B. FIG. 3C shows a fishbone pattern of first and second macro cells 151, 152 having an identical size.

As has been discussed above, due to the arrangement of the macro cells each comprising differently orientated trenches, it is possible to reduce electrical problems when forming bond wires running parallel to the trenches. In more detail, such electrical problems may be caused by stray inductances when the bond wires extend parallel to the mesas arranged between the trenches. On the other hand, due to the parallel orientation of the bond wires with respect to the trenches and mesas mechanical problems during the formation of the bond wires may be reduced. In more detail, as has been described above, contact grooves are formed in an insulating layer above the semiconductor substrate. When bonding in a direction perpendicular to the extension direction of the contact grooves, the semiconductor device may be mechanically destroyed. For this reason, bonding in a direction parallel to the extension direction of the contact grooves may avoid these problems. For example, problems arising when hard metal, e.g. Cu, is used for the conductive layer 106 may be reduced. Additionally, when also a hard metal such Cu is used for bond wires, problems may be reduced.

The bond wire(s) 107 may for example comprise at least one of Cu (Copper), Ag (silver), any Cu alloy, and any Ag alloy. The bond wire(s) 107 may for example consist of Cu (Copper), Ag (silver), any Cu alloy, any Ag alloy, or a combination of Cu and Ag. The conductive layer 106 may for example comprise at least one of Cu (Copper), Ag (silver), any Cu alloy, and any Ag alloy. The conductive layer 106 may for example consist of Cu (Copper), Ag (silver), any Cu alloy, any Ag alloy, or a combination of Cu and Ag.

Bonding in a parallel direction in turn results in bond wires extending parallel to the extension direction of the contact grooves and the trenches. Electrical problems caused by this orientation may be reduced by implementing the semiconductor device comprising macro cells having differently orientated trenches. Due to the further implementation comprising connection trenches that electrically connect conductive trenches, an area consumption needed for the arrangement of rotated macro cells may be reduced. In more detail, the trenches may be contacted without the need to form additional contact holes. Accordingly, the number of source contacts for contacting source trenches may be reduced. Moreover, the due to the presence of connection trenches, the trenches of the macro cells may be easily contacted.

According to an alternative interpretation, the semiconductor device 10 as described herein comprises a transistor 20. The transistor 20 comprises a plurality of macro cells 151, 152. The plurality of macro cells comprises first macro cells 151 and second macro cells 152. The first and the second macro cells 151, 152 each comprise a plurality of trenches 130 formed in a first main surface of a semiconductor substrate 100. The trenches pattern the semiconductor substrate 100 into mesas 160. The plurality of trenches 130 comprises a conductive trench 131, wherein a conductive material arranged in the conductive trench 131 is electrically connected to a terminal 180, 185. The trenches 130 of the first macro cell 151 run in the first direction, e.g. the x-direction. The trenches of the second macro cell 152 run in a second direction e.g. y-direction, different from the first direction. At least one of the first macro cells 151 further comprises a first connection trench 141 that runs in the first direction. A conductive material is arranged in the first connection trench 141. The conductive material of the first connection trench 141 is electrically connected to a plurality of conductive trenches of at least one of the second macro cells 152.

For example, a majority of all the trenches 130 of the first macro cell 151 run exclusively in the first direction. Further, a majority of all the trenches 130 of the second macro cell 152 exclusively run in the second direction which is different from the first direction.

By way of example, the terminal may be a gate terminal 185. The trenches 130 of the first macro cell 151 and the trenches of the second macro cell 152 further comprises a source trench 133, respectively, wherein a conductive material in the source trench 133 is electrically connected to a source terminal 180. The trenches may further comprise a gate trench wherein a conductive material in the gate trench 137 is electrically connected to a gate terminal 185.

According to a further example, the concept describe above may also be applied to a semiconductor device in which the respective orientations are not defined by an extension direction of trenches. To be more specific, such a semiconductor device does not need to comprise trenches in a semiconductor substrate or the orientations of such trenches may be arbitrary. According to this example, a semiconductor device 10 as described herein comprises a semiconductor substrate 100 and an insulating layer 105 over the semiconductor substrate. The semiconductor device comprises a plurality of macro cells 151, 152 including a first macro cell 151 and a second macro cell 152. The first macro cell 151 comprises first contact grooves 146 for electrically contacting a portion of the semiconductor substrate 100 and the second macro cell 152 comprising second contact grooves 147 for electrically contacting a portion of the semiconductor substrate 100. A majority of the first contact grooves 146 exclusively run in a first direction, and a majority of the second contact grooves 147 exclusively run in a second direction different from the first direction. At least one first macro cell 151 is arranged adjacent to at least one second macro cell 152.

For example, any of the first and the second contact grooves is configured to be connected to an outside terminal, e.g. a source terminal or a gate terminal by means of a bond wire.

Figure 4A:
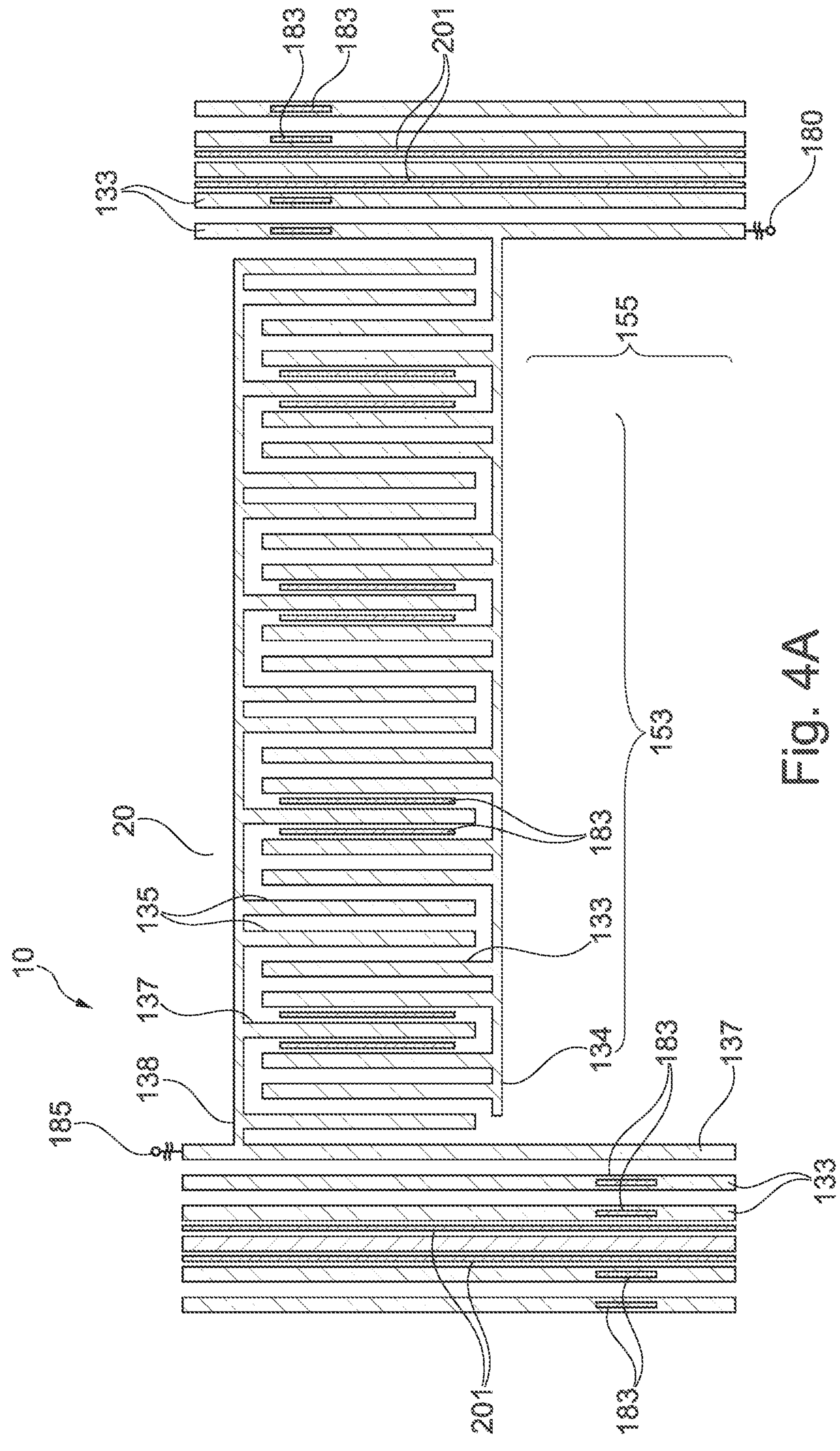
FIG. 4A shows a horizontal cross-sectional view of a portion of a semiconductor device according to further embodiments.

FIG. 4A shows a schematic horizontal cross-sectional view of a semiconductor device according to further embodiments. As is illustrated in FIG. 4A, a semiconductor device 10 comprises a transistor 20. The transistor 20 comprises a comb cell 153 which comprises a plurality of trenches 130 which are formed in a first main surface 110 of a semiconductor substrate 100. The trenches 130 pattern the semiconductor substrate into mesas 160. The plurality of trenches 130 comprises gate trenches 137 and source trenches 133, a source connection trench 134, and a gate connection trench 138. The source connection trench 134 electrically connects a conductive material in the source trenches 133 to a source terminal 180. The gate connection trench 138 electrically connects a conductive material in the gate trenches 137 to a gate terminal 185. The source connection trench 134 connects a conductive material in the source trenches 133 to a source terminal 180. For example, the source connection trench 134 and the gate connection trench may connect both the active and the dummy trenches.

The gate trenches 137 and the source trenches 133 run in a first direction. The gate trenches 137 and the source trenches 133 form an interdigital structure. For example, it is not necessary, that source trenches 133 and gate trenches 137 are arranged strictly alternatingly. For example, as is also illustrated in FIG. 4A, two source trenches 133 may be arranged adjacent to each other, followed by a gate trench 137.

The source connection trench 134 and the gate connection trench 138 run in a second direction different from the first direction. According to embodiments that are illustrated in FIG. 4A, the source and the gate connection trenches 134, 138 are arranged at the edge of an arrangement of the source trenches 133 and the gate trenches 137. For example, the trenches that are arranged between the source connection trench 134 and the gate connection trench 138 may exclusively run in the first direction. The gate connection trench 138 and the source connection trench 134 are open at their respective ends. Further all the mesas that are arranged between the source connection trench 134 and the gate connection trench 138 are connected. As a result, connection parasitic effects that could be caused by a loop formed with a bond wire above the semiconductor substrate may be reduced.

For example, a further gate trench 137 which is electrically connected to a gate terminal 185 may be arranged on a first side of the comb cell 153. The further gate trench is electrically connected to the gate connection trench 138.

Moreover, a further source trench 133 which is electrically connected to a source terminal 180 may be arranged on a second side of the comb cell 153. The further source trench 133 is electrically connected to the source connection trench 134.

The transistor may be implemented in the manner as has been discussed above with reference to FIG. 2.

According to embodiments, the transistor 20 may comprise a plurality of comb cells 153 which are arranged along the first direction, e.g. the x-direction. An intermediate region 155 may be arranged between two neighboring comb cells 153. As is illustrated in FIG. 4A trenches 130 may be absent from the intermediate region 155. For example, due to the presence of the intermediate region 155 and the absence of trenches, the semiconductor substrate and the semiconductor device may be locally strengthened. As a result, the semiconductor device may have an improved mechanical stability against local hard mechanical post processing such as a bonding process.

The source connection trench 134 may be implemented by more than one trench e.g. two or three trenches. In a corresponding manner, also the gate connection trench 138 may be implemented by more than two trenches, e.g. two, three or more trenches.

Figure 4B:
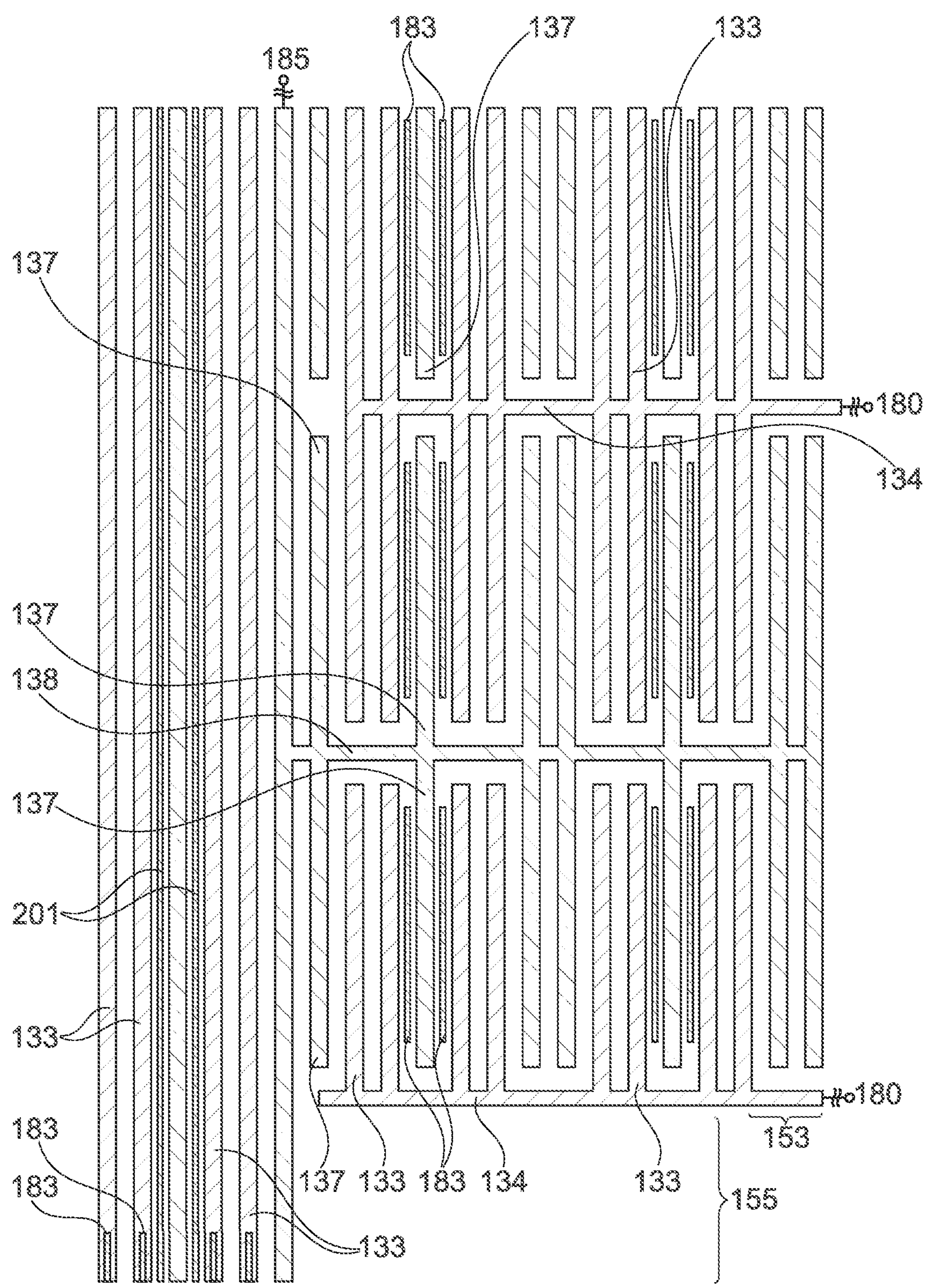
FIG. 4B shows a further horizontal cross-sectional view of a semiconductor device according to further embodiments.

FIG. 4B shows a horizontal cross-sectional view of a semiconductor device according to further embodiments. As is illustrated, in a comb cell 153, the source trenches 133 may extend in opposite directions from a source connection trench 134. According to embodiments, the gate trenches 137 may extend in opposite directions from a gate connection trench 138. As a result, a kind of a double-sided or multi-sided comb cell 153 is formed. Moreover, the comb cell may comprise a plurality of source connection trenches 134 and/or gate connection trenches 138.

By way of example, a comb cell may comprise a source connection trench 134 and/or a gate connection trench 138 which is arranged at the edge of the double-sided or multi-sided comb cell 153. As a result, a source connection trench 134 and/or a gate connection trench 138 encloses the double-sided or multi-sided comb cell 153.

For example, combs of different arrangements may be combined in one semiconductor device. The spaces between the different comb cells 153 may be implemented without any trenches.

According to embodiments that are described with reference to FIGS. 4A and 4B, a portion of the semiconductor device may be created in which the trenches are electrically connected to a source potential or a gate potential, without the need of forming additional contact elements and further wirings over the substrate surface. As a consequence, the mechanical stress that may be caused by forming additional contact elements may be reduced. Due to the arrangement of source trenches and gate trenches in an interdigital structure, losses of active area may be avoided.

Figure 5A:
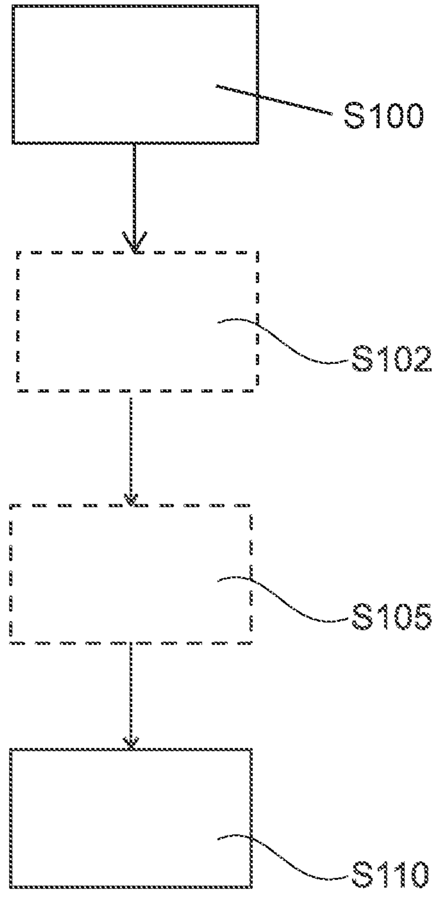
FIG. 5A summarizes a method according to embodiments.

FIG. 5A summarizes a method for manufacturing a semiconductor component according to an example. The method comprises forming (S100) a semiconductor device comprising a transistor. The transistor comprises a plurality of macro cells, the plurality of macro cells comprising a first macro cell and a second macro cell, each of the first and the second macro cells comprising a plurality of trenches formed in a first main surface of a semiconductor substrate, the trenches patterning the semiconductor substrate into mesas. A majority of all the trenches of the first macro cell exclusively run in a first direction. A majority of all the trenches of the second macro cell exclusively run in a second direction different from the first direction. The method further comprises bonding (S110) a bond wire to the semiconductor device in a bond area above at least one of the first macro cell and the second macro cell.

The method may further comprise determining (S105) a location of the bond area for the subsequent step of bonding the bond wire, the location of the bond area being above either one of the first macro cell and the second macro cell depending on a desired bond angle between the bonding wire and at least one of the first direction and the second direction.

The method may further comprise forming (S102) a passivation layer 170 at least partly above a metallization layer at a frontside of the semiconductor device, the passivation layer comprising marker portions, wherein an appearance and/or pose of the marker portions is related to a relative position or an orientation of at least one of the first or second macro cells. For example, the step of determining (S105) the location of the bond area may be carried out utilizing the information indicated by the marker portions. For example, the bond area may be determined under consideration of the marker portions.

As is to be clearly understood, any of the features described above with respect to the semiconductor device may be applied to the method for manufacturing the semiconductor component. The desired bond angle between the bond wire 107 and the first direction 196 or the second direction 197, respectively, can for example be in a range between −30° and +30° or even within −15° and +15°. Depending of the direction, from where the bond wire 107 is guided to the semiconductor device 10, the bond wire 107 may be bonded either above one of the first macro cells 151 or above one of the second macro cells 152. This way it is allowed to keep the bonding angle within the above mentioned range regardless of the origin of the bond wire 107.

Figure 5B:
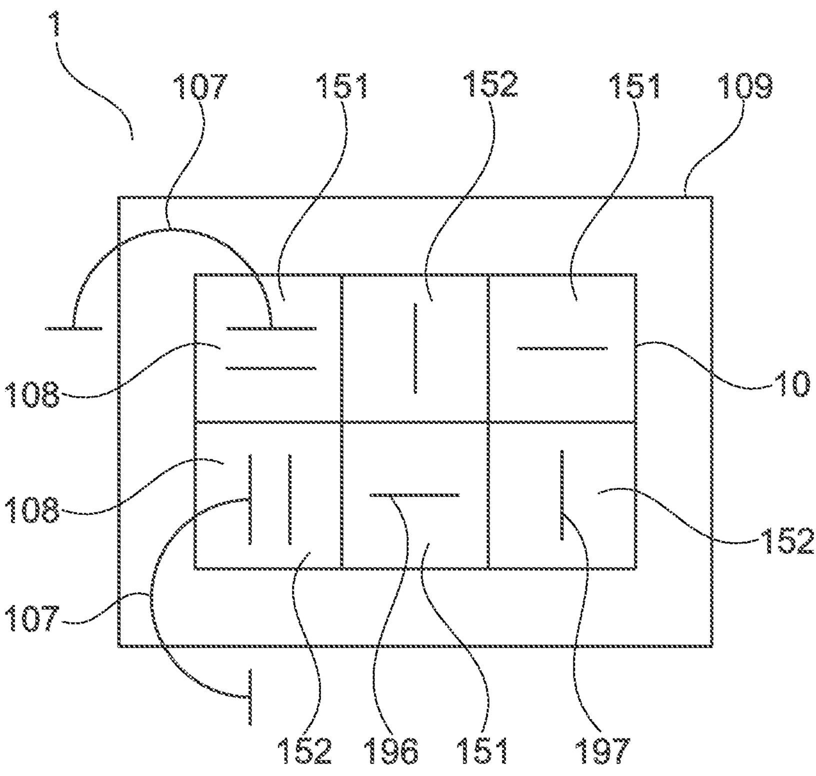
FIG. 5B shows an example of a semiconductor component comprising a semiconductor device.

FIG. 5B illustrates an example of a semiconductor component 1. The semiconductor component 1 comprises the semiconductor device 10 which has been explained above and a lead frame 109 on which the semiconductor device 10 is mounted. Although FIG. 5B illustrates a specific arrangement of first macro cells 151 and second macro cells 152, it is clearly to be understood that the semiconductor device 10 may implement any arbitrary arrangement of first and second macro cells 151, 152. FIG. 5B illustrates, similarly to FIGS. 3A to 3C, an example of an orientation of the trenches or contact grooves represented by the first and second direction 196, 197 within the first and second macro cells 151, 152. An electrical contact to a terminal may be accomplished by means of a bond wire 107 that is electrically connected to a bond area 108 within the first or the second macro cell 151, 152.

When selecting a bond area 108 in the first macro cell 151, a bonding direction in or close to the first direction may be selected. As a consequence, the bond wire 107 may extend in a direction close to the first direction. When selecting a bond area 108 in the second macro cell 152, a bonding direction in or close to the second direction may be selected. As a consequence, the bond wire 107 may extend in a direction close to the second direction.

Figure 6A:
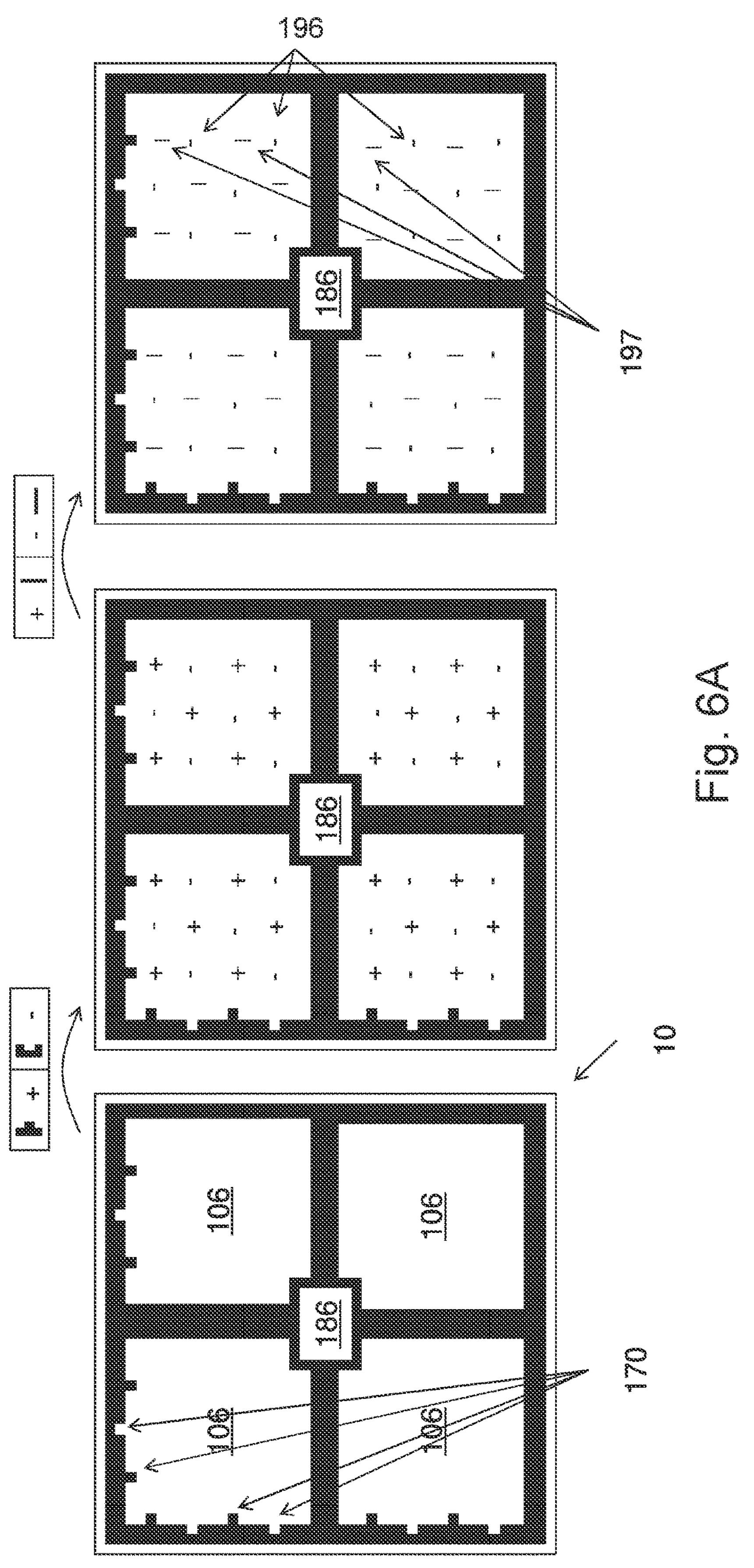
FIGS. 6A and 6B show different examples of a semiconductor device comprising a passivation layer including markers indicating the orientation of macro cells.
Figure 6B:
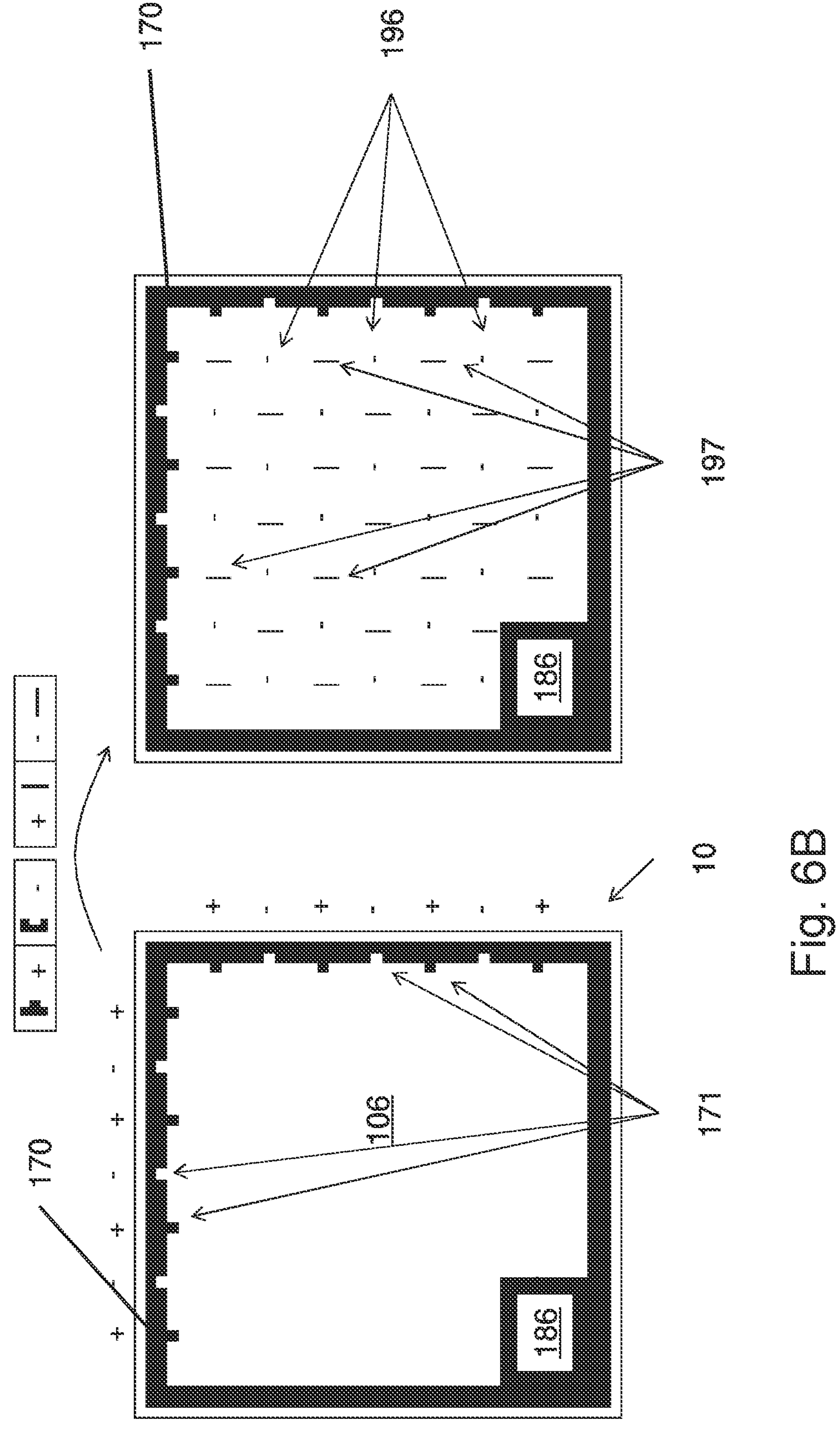

FIGS. 6A and 6B illustrate a semiconductor device 10 comprising a passivation layer 170 at least partly above a metallization layer at the frontside of the semiconductor device 10. The passivation layer 170 may cover at least parts of said metallization layer. Said metallization layer may comprise or consist of at least one of the conducting layer 106 and a gate pad 186. The gate pad 186 may be part of the control terminal 180. More particular, the passivation layer 170 may be arranged close to a chip edge or a junction termination area. Alternatively or additionally, the passivation layer 170 may cover gaterunner and/or gatefinger areas of the semiconductor device 10. The passivation layer 170 may, for example, comprise an imide. Needless to mention, bonding areas of the conducting layer 106 and the gate pad 186 are not covered by the passivation layer 170.

To allow a more accurate bonding with respect to the macro cells 151, 152, the passivation layer 170 may comprise marker portions 171. The marker portions 171 are indicating the orientation of the macro cells 151, 152. The marker portions 171 may comprise any random code suitable for indicating the orientation of at last one of the macro cells 151, 152. E.g. an appearance and/or pose of the marker portions 171 may be related to a relative position of at least one of the first or second macro cells 151, 152. The marker portions 171 comprise a pattern indicating the orientation of at last one of the macro cells 151, 152, e. g. the orientation of at last one of the first macro cells 151 or at least one of the second macro cells 152.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor, the transistor comprising a plurality of macro cells, the plurality of macro cells comprising first macro cells and second macro cells, each of the first and the second macro cells comprising:

- a plurality of trenches formed in a first main surface of a semiconductor substrate, the trenches patterning the semiconductor substrate into mesas,
- wherein the plurality of trenches comprises a conductive trench, a conductive material arranged in the conductive trench being electrically connected to a terminal,
- wherein the trenches of the first macro cell run in a first direction,
- wherein the trenches of the second macro cell run in a second direction different from the first direction,
- wherein at least one of the first macro cells further comprises a first connection trench running in the first direction, a conductive material being arranged in the first connection trench,
- wherein the conductive material of the first connection trench is electrically connected to a plurality of conductive trenches of at least one of the second macro cells,
- wherein the terminal is a source terminal.

2. The semiconductor device of claim 1, wherein each of the first macro cells further comprises a first connection trench running in the first direction, a conductive material being arranged in the first connection trench, and wherein the conductive material of the first connection trench is electrically connected to a plurality of conductive trenches of the second macro cells.

3. The semiconductor device of claim 1, further comprising

- an insulating layer over the semiconductor substrate; and
- a first contact groove formed in the insulating layer and contacting a mesa of the first macro cells, a lateral extension of the first contact groove in the first direction being larger than a lateral extension of the first contact groove in the second direction.

4. The semiconductor device of claim 3, further comprising:

- a second contact groove formed in the insulating layer and contacting a mesa of the second macro cells, a lateral extension of the second contact groove in the second direction being larger than a lateral extension of the second contact groove in the first direction.

5. The semiconductor device of claim 3, wherein the mesa contacted by the first contact groove comprises a doped semiconductor portion in contact with the first contact groove.

6. The semiconductor device of claim 1, wherein the trenches in the first macro cells and the trenches in the second macro cells further comprise a gate trench, and wherein a conductive material in the gate trenches is electrically connected to a gate terminal and insulated from adjacent semiconductor material of the semiconductor substrate.

7. The semiconductor device of claim 1, wherein the plurality of mesas comprise a dummy mesa that is disconnected from a terminal.

8. The semiconductor device of claim 1, wherein a number of trenches of the first macro cells is identical with a same number of trenches of the second macro cells.

9. The semiconductor device of claim 1, wherein the first and the second macro cells are arranged to form a checkerboard pattern.

10. The semiconductor device of claim 9, wherein the first and the second macro cells are arranged in columns and rows, an array of macro cells comprising an odd number of columns of macro cells and an odd number of rows of macro cells.

11. The semiconductor device of claim 1, wherein the trenches in the first macro cell and the trenches in the second macro cell further comprise a source trench, respectively, and wherein a conductive material in the source trench is electrically connected to a source terminal.

12. The semiconductor device of claim 1, wherein the trenches in the first macro cell and the trenches in the second macro cell further comprise a gate trench, respectively, and wherein a conductive material in the gate trench is electrically connected to a gate terminal.

13. A semiconductor device comprising a transistor, the transistor comprising a comb cell comprising a plurality of trenches formed in a first main surface of a semiconductor substrate, the trenches patterning the semiconductor substrate into mesas, wherein:

- the plurality of trenches comprises gate trenches and source trenches, a source connection trench, and a gate connection trench;
- the source connection trench connects a conductive material in the source trenches to a source terminal;
- the gate connection trench connects a conductive material in the gate trenches to a gate terminal;
- the gate trenches and the source trenches run in a first direction; and
- the source connection trench and the gate connection trench run in a second direction different from the first direction, wherein the semiconductor device further comprises a passivation layer at least partly above a metallization layer at a frontside of the semiconductor device, the passivation layer comprising marker portions indicating the orientation of at least one of the macro cells.

14. The semiconductor device of claim 13, wherein the transistor comprises a plurality of comb cells arranged along the first direction, an intermediate region being arranged between two neighbouring comb cells, and wherein trenches are absent from the intermediate region.

* * * * *